United States Patent [19]

Matsui

[11] Patent Number: 5,302,456
[45] Date of Patent: Apr. 12, 1994

[54] ANISOTROPIC CONDUCTIVE MATERIAL AND METHOD FOR CONNECTING INTEGRATED CIRCUIT ELEMENT BY USING THE ANISOTROPIC CONDUCTIVE MATERIAL

[75] Inventor: Koji Matsui, Tokyo, Japan
[73] Assignee: NEC Corporation, Tokyo, Japan
[21] Appl. No.: 879,303
[22] Filed: May 7, 1992
[30] Foreign Application Priority Data
May 7, 1991 [JP] Japan .................. 3-101370
[51] Int. Cl.$^5$ .................. B32B 5/16; B32B 7/12
[52] U.S. Cl. .................. 428/407; 428/328;
428/356; 428/402.24; 437/8; 437/209; 437/211
[58] Field of Search .......... 428/328, 356, 407, 402.24; 437/8, 209, 211

[56] References Cited

U.S. PATENT DOCUMENTS

| | | | |
|---|---|---|---|
| 4,735,847 | 4/1988 | Fujiwara et al. | 428/209 |
| 5,120,665 | 6/1992 | Tsukagoshi et al. | 437/209 |

FOREIGN PATENT DOCUMENTS 3623413 1/1988 Fed. Rep. of Germany .
2-294097 12/1990 Japan .

Primary Examiner—John Kight, III
Assistant Examiner—T. Mosley
Attorney, Agent, or Firm—Burns, Doane, Swecker & Mathis

[57] ABSTRACT

An anisotropic conductive material includes micro-capsules dispersed in a bonding resin. The micro-capsules contains, as a filler material, a conductor and a polymerization initiator, a curing agent or a curing promotor. A wall member encapsulating the filler material is formed of a thermoplastic or thermosetting insulative resin. Therefore, if the micro-capsules in the anisotropic conductive material are broken or destroyed by pressure or both of pressure and heat, electrical connection can be established between electrode pads and electrode terminals of a wiring substrate through the conductors contained in the micro-capsules. Simultaneously, the polymerization initiator, the curing agent or the curing promotor flows out, so that the insulative bonding resin is solidified. Thus, the anisotropic conductive material has a high connection reliability, a good reproducibility, an excellent packaging workability, and excellent shelf stability.

19 Claims, 1 Drawing Sheet

ANISOTROPIC CONDUCTIVE MATERIAL AND METHOD FOR CONNECTING INTEGRATED CIRCUIT ELEMENT BY USING THE ANISOTROPIC CONDUCTIVE MATERIAL

BACKGROUND OF THE INVENTION

1. Field of the Invention

The present invention relates to an electric connecting anisotropic conductive material used for bonding and connecting fine electrodes of a LSI chip or another to electrodes formed on a wiring package substrate. The present invention also relates to a method for connecting and bonding an element such as LSI chip onto a wiring package substrate, by using the anisotropic conductive material.

2. Description of Related Art

In the prior art, this type of electric connecting anisotropic conductive material has been formed of conductive particles dispersed in an insulative bonding agent. Connection has been achieved by a heat press bonding performed under a pressure of 20 Kg/cm$^2$ to 30 Kg/cm$^2$ at a temperature of 180° C. to 200° C. For example, the conductive particles have been formed of solder particles or particles formed of a macromolecular material such as divinylbenzene copolymer and having a surface coated with a conductive metal thin film of Au, Ni, etc. The conductive particles have an averaged particle size of 0.01 $\mu$m to 50 $\mu$m. The insulative bonding agent has been formed of, for example, a thermoplastic resin such as urethanes or styrene-butadiene-styrene type block copolymers. Alternatively, a thermosetting resin of epoxy type or others has been used. The anisotropic conductive material is dispersed in the insulative bonding resin with a proportion of 1% by volume to 10% by volume.

In addition, in a conventional packaging method, an LSI chip formed with electrode pads and a wiring substrate formed with electrode terminals in correspondence to the electrode pads are located to oppose to each other, with a hot-melt adhesive resin containing conductive particles dispersed therein being interposed between the LSI chip and the wiring substrate. Thereafter, the LSI chip is depressed onto the wiring substrate, and the whole is heated, so that the hot-melt adhesive resin is softened, and the electrode pads and the corresponding electrode terminals are electrically connected through the conductive particles.

In the above mentioned conventional connecting and bonding method, if the amount of the conductive particles for electrically connecting between the electrode pads and the corresponding electrode terminals becomes much, a short-circuit or a current leakage will occur between adjacent electrode pads and between adjacent electrodes. In order to avoid this problem, if the amount of the conductive particles is reduced, a connection resistance will not only increase but also vary. In ultimate cases, the electrode pads and the corresponding electrode terminals to be connected to each other remain in an electrically opened condition. This is a serious defect which will cause a malfunction of the devices. In addition, this inclination will become remarkable more and more with a recent microminiaturization of connection sizes.

SUMMARY OF THE INVENTION

Accordingly, it is an object of the present invention to provide an electric connecting anisotropic conductive material which has overcome the above mentioned defect of the conventional one.

Another object of the present invention is to provide a means for connecting an LSI chip, which means is excellent in reproducibility, and stable, and which means can comply with microminiaturization.

Still another object of the present invention is to provide a method for connecting and bonding an element such as LSI chip onto a wiring substrate, by using the anisotropic conductive material in accordance with the present invention.

The above and other objects of the present invention are achieved in accordance with the present invention by an anisotropic conductive material which includes micro-capsules dispersed in an insulative resin, each of the micro-capsules containing a filler material composed of a conductor and an acting material which acts on the insulative resin so as to solidify the insulative resin, a wall member encapsulating the filler material being formed of an insulative material.

In preferred embodiments, the acting material is composed of a material from the group consisting of a polymerization initiator, a curing agent and a curing promotor, and the insulative material is composed of a material from the group consisting of a thermoplastic resin and a thermosetting insulative resin. In the case that the acting material is composed of the curing promotor, the micro-capsules are dispersed in the insulative resin together with a curing agent which can react with the curing promotor.

Furthermore, according another aspect of to the present invention there is provided a method for bonding a semiconductor chip onto a bonding region of a wiring substrate by use of an anisotropic conductive material, which includes micro-capsules dispersed in an insulative resin, the micro-capsules containing, as a filler material, a conductor and an acting material which acts on the insulative resin so as to solidify the insulative resin, a wall member encapsulating the filler material being formed of a insulative material, the method including the steps of:

interposing the anisotropic conductive material between the semiconductor chip and the bonding region of the wiring substrate; and relatively depressing the semiconductor chip onto the wiring substrate, so as to cause to crush the micro-capsules included in the anisotropic conductive material, whereby the acting material in the micro-capsules acts on the insulative material, so that the insulative resin is solidified and the semiconductor chip is electrically connected to the wiring substrate by the conductor included in the micro-capsules.

As seen from the above, the anisotropic conductive material in accordance with the present invention includes micro-capsules dispersed in the insulative resin. The micro-capsules contain, as the filler material, the conductor and the acting material (such as polymerization initiator, a curing agent or a curing promotor) which acts on the insulative resin so as to solidify the insulative resin, and a wall member encapsulating the filler material is formed of a thermoplastic or thermosetting insulative resin.

Since the micro-capsules are insulative, when electrode pads and electrodes terminals are to be electrically connected by use of this anisotropic conductive material, an electrical connection becomes possible by breaking or destroying the micro-capsules by pressure or both of pressure and heat, so as to forcibly cause the electrode pads and the corresponding electrodes terminals to be electrically connected to each other through the conductors contained in the micro-capsules. At the same time, the polymerization initiator, the curing agent or the curing promotor flows out of the micro-capsules, so that the insulative bonding resin is solidified.

Thus, only the electrode pads of the LSI chip and the electrode terminals of the wiring substrate becomes connectable to each other, and the other portions of the LSI chip and the wiring substrate are maintained in an insulated condition because of the insulative resin of the surface of the micro-capsules.

The above and other objects, features and advantages of the present invention will be apparent from the following description of preferred embodiments of the invention with reference to the accompanying drawings.

DESCRIPTION OF THE PREFERRED EMBODIMENTS

Figure 1:
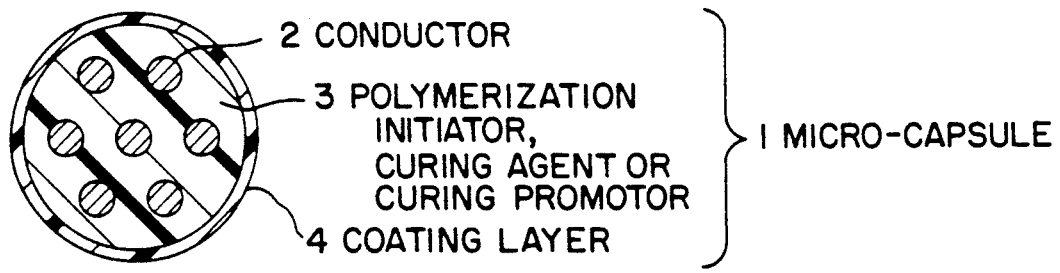
FIG. 1 is a view showing a structure of the micro-capsule included in the anisotropic conductive material in accordance with the present invention.

Referring to FIG. 1, there is shown a structure of the micro-capsule in the anisotropic conductive material, as one embodiment of the present invention. FIG. 2 illustrates one embodiment of the method for connecting and bonding between microminiaturized electrode pads of an LSI chip and electrode terminals of a wiring substrate by using the anisotropic conductive material of the present invention.

In FIG. 1, a micro-capsule 1 includes conductors 2 and a polymerization initiator, a curing agent or a curing promotor 3, which are encapsulated with a coating layer 4 of macromolecular insulative material.

The conductors 2 are formed of metal particles such as solder particles, or particles formed of a macromolecular material such as divinylbenzene copolymer and having a surface coated with a conductive metal thin film of Au, Ni, etc.

The conductors have an averaged particle size of 0.01 $\mu$m to 50 $\mu$m. In this connection, the conductors 2 can be formed in the shape of a wire or a fiber.

When polymerization initiator such as ketone-peroxides, dialkyl-peroxides, peroxy-esters and diacyl-peroxides and/or curing promotor such as imidazoles or transition metal reaction promotors such as cobalt naphthenate is used, the micro-capsules 1 containing the conductors 2 and the polymerization initiator and/or curing promotor and encapsulated with a coating layer 4 made of macromolecular insulative material are dispersed in an adhesive resin (matrix) such as unsaturated polyesters, methacrylates and phenols to produce an anisotropic conductive material. The amount of the polymerization initiator is preferred to be 0.01 parts by weight to 10 parts by weight in 100 parts by weight of the adhesive resin.

The curing agent can be amines. When amine curing agent such as aromatic amine like methaphenylenediamine, diaminodiphenylmethane and diaminodiphenysulfone; polymethylenediamines such as hexamethylenediamine, octamethylenediamine and decanemethylenediamine; bis(4-aminocyclo-hexyl)methane; polyamidepolyamine; methylimidazoles is used, microcapsules 1 containing the conductors 2 and the amine curing agent and encapsulated with a macromolecular insulative material are dispersed in a bonding resin (matrix) such as an epoxy resin and an acrylate resin to produce an anisotropic conductive material. The amount of the curing agent is preferred to be 0.1 parts by the weight to 100 parts by weight in 100 parts by weight of the bonding resin.

In this type of anisotropic conductive material, the epoxy resin can be mixed with a heat curing material such as hydrazides, amine-imides and dicyandiamindes, other than the micro-capsules.

Furthermore, when the curing promotor such as imidazoles, imidazolines, 3-substituted phenyl-1,1-dimethyl urea, alkyl substituted guanidines, monoaminopyridines and amine-imides is used, the curing promotor and the conductors 2 are encapsulated with the coating layer 4 made of a macromolecular insulative material to produce micro-capsules 1. The resulting micro-capsules 1 are dispersed in a bonding resin 9 (matrix) such as an epoxy resin and an acrylate resin together with a curing agent such as hydrazides, amine-imides, dicyandiamindes and amines. The amount of the curing promotor is preferred to be 0.1 parts by weight to 50 parts by weight in 100 parts by weight of the bonding resin, and the amount of the curing agent is preferred to be 1 part by weight to 20 parts by weight in 100 parts by weight of the bonding resin.

Next, the bonding and connecting method of the present invention will be described with reference to FIGS. 2(a) and 2(b), which illustrate the steps of bonding and connecting an LSI chip in accordance with the method of the present invention.

Figure 2A:
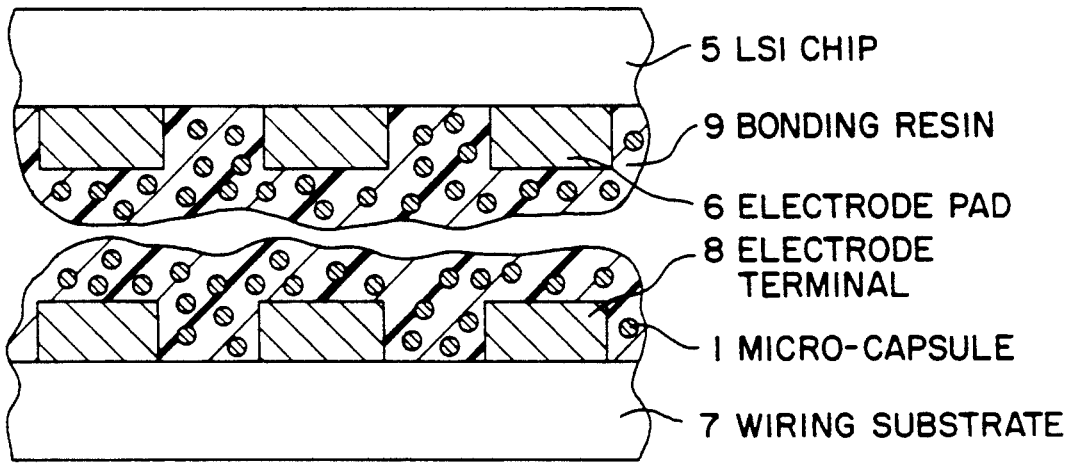
FIGS. 2A and 2B are sectional views illustrating the steps of the method in accordance with the present invention for connecting and bonding an LSI chip.

As shown in FIG. 2(a), an LSI chip 5 has a surface formed with electrodes pads 6, and a wiring substrate 7 is formed with electrode terminals 8 in correspondence to the electrode pads 6 of the LSI chip 5. A surface of the electrode pads 6 of the LSI chip 5 is washed, and thereafter, the bonding resin 9 containing the micro-capsules 1 therein is applied or coated on the surface of the LSI chip 5 including the electrode pads 6. On the other hand, a surface of the wiring substrate 7 of the side of the electrode terminals 8 is washed, and then, the bonding resin 9 containing the micro-capsules 1 therein is applied or coated on the surface of the wiring substrate 7 of the side of the electrode terminals 8. Thereafter, the LSI chip 5 is located on the wiring substrate 7 in such a manner that the electrode pads 6 oppose the electrode terminals 8.

Figure 2B:
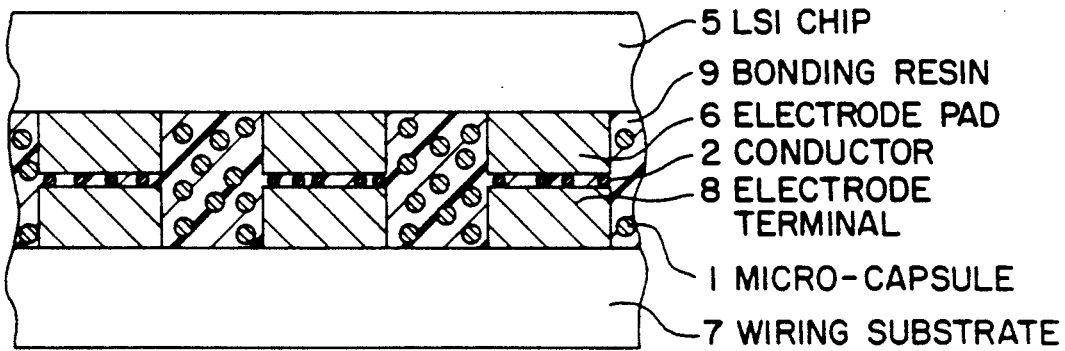

As shown in FIG. 2(b), the LSI chip 5 is pushed or depressed against the wiring substrate 7 by applying a weight load, so as to cause to break or destroy the micro-capsules 1, and to cause the electrode pads 6 to be bonded or joined with the corresponding electrode terminals 8. Because the micro-capsules 1 are broken or destroyed, the polymerization initiator (or the curing agent or the curing promotor) in the capsules flows out, so that the bonding resin 9 is solidified.

As a result, the electrode pads 6 and the corresponding electrode terminal 8 are electrically connected to each other through the conductors 2, and the LSI chip 5 and the wiring substrate 7 are bonded to each other.

As explained above, the anisotropic conductive material in accordance with the present invention includes micro-capsules which is dispersed in an insulative resin and which contains, as a filler material, a conductor and an acting material (such as a polymerization initiator, a curing agent or a curing promotor) acting on the insulative resin so as to solidify the insulative resin. A wall member encapsulating the filer material is formed of an insulative material. Therefore, when electrode pads and electrodes terminals are to be electrically connected, the micro-capsules are broken or destroyed by pressure or both of pressure and heat, so that the polymerization initiator, the curing agent or the curing promotor flows out, and therefore, the insulative bonding resin is solidified. Accordingly, according to the connecting and bonding method of the present invention, electrical connection can be established only between the electrode pads of the LSI chip and the electrode terminals of the wiring substrate. The other portions of the LSI chip and the wiring substrate are maintained in an insulated condition because of the insulative resin of the surface of the micro-capsules. Therefore, a high connection reliability and an excellent packaging workability can be obtained. In particular, the present invention is very effective in highly microminiaturized connection.

In addition, in the anisotropic conductive material in accordance with the present invention, the polymerization initiator, the curing agent or the curing promotor is encapsulated in the micro-capsules, and therefore, is separated from the bonding resin. Accordingly, keeping quality is good, and shelf stability is excellent.

The invention has thus been shown and described with reference to the specific embodiments. However, it should be noted that the present invention is in no way limited to the details of the illustrated structures but changes and modifications may be made within the scope of the appended claims.

I claim:

1. An anisotropic conductive material including micro-capsules dispersed in an insulative resin, each of said micro-capsules containing a filler material composed of a conductor and an acting material which acts on said insulative resin so as to solidify said insulative resin, a wall member encapsulating said filler material being formed of an insulative material.

2. A anisotropic conductive material claimed in claim 1 wherein said conductor included in each micro-capsule includes conductive particles selected from the groups consisting of metal particles and macromolecular material particles having a surface coated with a conductive metal thin film.

3. A anisotropic conductive material claimed in claim 2 wherein said conductive particles has an averaged particle size of 0.01 μm to 50 μm.

4. A anisotropic conductive material claimed in claim 1 wherein said conductor included in each micro-capsule is composed of conductive wires or conductive fibers.

5. A anisotropic conductive material claimed in claim 1 wherein said wall member is formed of a macromolecular insulative material.

6. A anisotropic conductive material claimed in claim 1 wherein said acting material consists of a polymerization initiator, and said insulative resin can react with said polymerization initiator.

7. A anisotropic conductive material claimed in claim 6 wherein said polymerization initiator is a material selected from the group consisting of ketone-peroxides, dialkyl-peroxides, peroxy-esters, and diacyl-peroxides, and said insulative resin is a material selected from the group consisting of unsaturated polyesters, methacrylates, and phenols, and wherein the amount of said polymerization initiator is 0.01 parts by weight to 10 parts by weight in 100 parts by weight of said insulative resin.

8. A anisotropic conductive material claimed in claim 1 wherein said acting material consists of a curing agent, and said insulative resin can react with said curing agent.

9. A anisotropic conductive material claimed in claim 8 wherein said curing agent is a material selected from the group consisting of imidazoles and a transition metal reaction promotor, and said insulative resin is a material selected from the group consisting of unsaturated polyesters, methacrylates, and phenols.

10. A anisotropic conductive material claimed in claim 8 wherein said curing agent is a material selected from the group consisting of aromatic amines, polymethylenediamines, bis(4-aminocyclo-hexyl)methane, polyamidepolyamine, methylimidazoles, and said insulative resin is a material selected from the group consisting of an epoxy resin and an acrylate resin, and wherein the amount of said curing agent is 0.1 parts by weight to 100 parts by weight in 100 parts by weight of said insulative resin.

11. A anisotropic conductive material claimed in claim 8 wherein said insulative resin is an epoxy resin, which contains a heat curing material selected from the group consisting of hydrazides, amine-imides and dicyandiamindes.

12. A anisotropic conductive material claimed in claim 1 wherein said acting material consists of a curing promotor, and said insulative resin includes curing agent which can react with said curing promotor.

13. A anisotropic conductive material claimed in claim 12 wherein said curing promotor is a material selected from the group consisting of imidazoles, imidazolines, 3-substituted phenyl-1,1-dimethyl urea, alkyl substituted guanidines, monoaminopyridines, and amine-imides, and wherein said insulative resin is a material selected from the group consisting of an epoxy resin and an acrylate resin, and said the curing agent included in said insulative resin is a material selected from the group consisting of hydrazides, amine-imides, dicyandiamindes and amines.

14. A anisotropic conductive material claimed in claim 13 wherein the amount of said curing promotor is 0.1 parts by weight to 50 parts by weight in 100 parts by weight of said insulative resin, and the amount of said curing agent is 1 part by weight to 20 parts by weight in 100 parts by weight of said insulative resin.

15. A method for bonding a semiconductor chip onto a bonding region of a wiring substrate by use of an anisotropic conductive material, which includes micro-capsules dispersed in an insulative resin, said micro-capsules containing, as a filler material, a conductor and an acting material which acts on said insulative resin so as to solidify said insulative resin, a wall member encapsulating said filler material being formed of a insulative material, the method including the steps of:

interposing said anisotropic conductive material between said semiconductor chip and said bonding region of said wiring substrate; and relatively depressing said semiconductor chip onto said wiring substrate, so as to cause to crush said micro-capsules included in said anisotropic conductive material, whereby said acting material in said micro-capsules acts on said insulative material, so that said insulative resin is solidified and said semiconductor chip is electrically connected to said wiring substrate by said conductor included in said micro-capsules.

16. A method claimed in claim 15 wherein said acting material is composed of a material from the group consisting of a polymerization initiator, a curing agent and a curing promotor, and said insulative material is composed of a material from the group consisting of a thermoplastic resin and a thermosetting insulative resin.

17. A method claimed in claim 15 wherein said depressing of said semiconductor chip onto said wiring substrate is performed under pressure or under both of pressure and heat.

18. The anisotropic conductive material defined in claim 1 consisting essentially of an insulative resin and micro-capsules dispersed in said insulative resin, each of said micro-capsules containing a filler material composed of a conductor and an acting material which acts on said insulative resin so as to solidify said insulative resin, a wall member encapsulating said filler material being formed of an insulative material.

19. An anisotropic conductive material including an insulative resin and micro-capsules dispersed in said insulative resin, each of said micro-capsules being formed of a wall member of an insulative material so as to form a closed space, a filler material composed of a conductor and an acting material which acts on said insulative resin so as to solidify said insulative resin, being encapsulated in each of said micro-capsules so as to completely fulfill said closed space.

* * * * *